(12) United States Patent
Gupta et al.

(10) Patent No.: US 11,370,656 B2
(45) Date of Patent: Jun. 28, 2022

(54) STACKED-DIE MEMS RESONATOR

(71) Applicant: SiTime Corporation, Santa Clara, CA (US)

(72) Inventors: Pavan Gupta, Belmont, CA (US); Aaron Partridge, Cupertino, CA (US); Markus Lutz, Mountain View, CA (US)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 17/143,119

(22) Filed: Jan. 6, 2021

(65) Prior Publication Data

US 2021/0179421 A1 Jun. 17, 2021

Related U.S. Application Data

(62) Division of application No. 16/903,116, filed on Jun. 16, 2020, now Pat. No. 10,913,655, which is a
(Continued)

(51) Int. Cl.
*B81B 7/00* (2006.01)
*B81C 1/00* (2006.01)
(Continued)

(52) U.S. Cl.
CPC ............ *B81B 7/0083* (2013.01); *B81B 7/007* (2013.01); *B81B 7/0077* (2013.01);
(Continued)

(58) Field of Classification Search
CPC ... H01L 23/34; H01L 23/498; H01L 23/3107; H01L 2224/48091; H01L 2224/48247;
(Continued)

(56) References Cited

U.S. PATENT DOCUMENTS 5,417,111 A 5/1995 Sherman et al.
5,620,931 A 4/1997 Tsang et al.
(Continued)

OTHER PUBLICATIONS

Office Action, U.S. Appl. No. 15/627,049, dated Jan. 14, 2021, 49 pages.

*Primary Examiner* — Jose R Diaz

(57) ABSTRACT

A low-profile packaging structure for a microelectromechanical-system (MEMS) resonator system includes an electrical lead having internal and external electrical contact surfaces at respective first and second heights within a cross-sectional profile of the packaging structure and a die-mounting surface at an intermediate height between the first and second heights. A resonator-control chip is mounted to the die-mounting surface of the electrical lead such that at least a portion of the resonator-control chip is disposed between the first and second heights and wire-bonded to the internal electrical contact surface of the electrical lead. A MEMS resonator chip is mounted to the resonator-control chip in a stacked die configuration and the MEMS resonator chip, resonator-control chip and internal electrical contact and die-mounting surfaces of the electrical lead are enclosed within a package enclosure that exposes the external electrical contact surface of the electrical lead at an external surface of the packaging structure.

24 Claims, 10 Drawing Sheets

Related U.S. Application Data division of application No. 16/372,745, filed on Apr. 2, 2019, now Pat. No. 10,723,617, which is a division of application No. 15/805,031, filed on Nov. 6, 2017, now Pat. No. 10,287,162, which is a division of application No. 15/187,748, filed on Jun. 20, 2016, now Pat. No. 9,821,998, which is a division of application No. 14/597,825, filed on Jan. 15, 2015, now Pat. No. 9,371,221, which is a division of application No. 14/191,978, filed on Feb. 27, 2014, now Pat. No. 8,941,247, which is a division of application No. 13/681,065, filed on Nov. 19, 2012, now Pat. No. 8,669,664, which is a division of application No. 13/151,316, filed on Jun. 2, 2011, now Pat. No. 8,324,729, which is a division of application No. 11/763,801, filed on Jun. 15, 2007, now Pat. No. 8,022,554.

(60) Provisional application No. 60/813,874, filed on Jun. 15, 2006.

(51) Int. Cl.
*H01L 41/113* (2006.01)
*H01L 23/34* (2006.01)
*H01L 23/498* (2006.01)
*H01L 23/31* (2006.01)

(52) U.S. Cl.
CPC ........ *B81C 1/0023* (2013.01); *B81C 1/00301* (2013.01); *B81C 1/00333* (2013.01); *B81C 1/00341* (2013.01); *H01L 23/34* (2013.01); *H01L 23/498* (2013.01); *H01L 41/1132* (2013.01); *B81B 2201/0271* (2013.01); *B81B 2207/07* (2013.01); *B81B 2207/094* (2013.01); *B81C 2201/016* (2013.01); *B81C 2203/0118* (2013.01); *B81C 2203/0154* (2013.01); *H01L 23/3107* (2013.01); *H01L 2224/48091* (2013.01); *H01L 2224/48245* (2013.01); *H01L 2224/48247* (2013.01); *H01L 2224/73265* (2013.01); *H01L 2924/01019* (2013.01); *H01L 2924/10253* (2013.01); *H01L 2924/1461* (2013.01); *H01L 2924/181* (2013.01)

(58) Field of Classification Search
CPC . H01L 2224/73265; H01L 2924/10253; H01L 2924/1461; H01L 2924/181; B81B 7/0083; B81B 2201/0271; B81C 2203/0154
See application file for complete search history.

(56) References Cited

U.S. PATENT DOCUMENTS

| | | | |
|---|---|---|---|
| 5,638,946 A | 6/1997 | Zavracky | |
| 5,858,809 A | 1/1999 | Chau et al. | |
| 5,919,364 A | 7/1999 | Lebouitz et al. | |
| 5,969,461 A | 10/1999 | Anderson et al. | |
| 5,991,989 A | 11/1999 | Onishi et al. | |
| 6,057,598 A | 5/2000 | Payne et al. | |
| 6,140,144 A | 10/2000 | Najafi et al. | |
| 6,175,157 B1 | 1/2001 | Morifuji | |
| 6,181,015 B1 | 1/2001 | Gotoh et al. | |
| 6,285,084 B1 | 9/2001 | Hikita et al. | |
| 6,307,452 B1 | 10/2001 | Sun | |
| 6,316,838 B1 | 11/2001 | Ozawa et al. | |
| 6,316,840 B1 | 11/2001 | Otani | |
| 6,335,224 B1 | 1/2002 | Peterson et al. | |
| 6,417,026 B2 | 7/2002 | Gotoh et al. | |
| 6,441,481 B1 | 8/2002 | Karpman | |
| 6,552,419 B2 | 4/2003 | Toyosawa | |
| 6,571,466 B1 | 6/2003 | Glenn et al. | |
| 6,583,512 B2 | 6/2003 | Nakaoka et al. | |
| 6,677,674 B2 | 1/2004 | Nagao | |
| 6,710,461 B2 | 3/2004 | Chou et al. | |
| 6,738,207 B1 | 5/2004 | Belser et al. | |
| 6,759,737 B2 | 7/2004 | Seo et al. | |
| 6,768,207 B2 | 7/2004 | Tao et al. | |
| 6,768,628 B2 | 7/2004 | Harris et al. | |
| 6,803,755 B2 | 10/2004 | Herbert et al. | |
| 6,846,725 B2 | 1/2005 | Nagarajan et al. | |
| 6,921,968 B2 | 7/2005 | Chung | |
| 6,956,283 B1 | 10/2005 | Peterson | |
| 6,977,431 B1 | 12/2005 | Oh et al. | |
| 7,034,393 B2 | 4/2006 | Alie et al. | |
| 7,074,647 B2 | 7/2006 | Owens et al. | |
| 7,098,517 B2 | 8/2006 | Matsuo | |
| 7,256,669 B2 | 8/2007 | Morrison, Jr. et al. | |
| 7,335,872 B2 | 2/2008 | Fukuda et al. | |
| 7,405,104 B2 | 7/2008 | Minamio et al. | |
| 7,419,853 B2 | 9/2008 | Kuhmann et al. | |
| 7,453,153 B2 | 11/2008 | Saita et al. | |
| 7,468,552 B2 | 12/2008 | Ohta | |
| 7,470,977 B2 | 12/2008 | Okubora | |
| 7,691,674 B1 | 4/2010 | Bathan et al. | |
| 7,735,368 B2 | 6/2010 | Nakatani | |
| 7,928,584 B2 | 4/2011 | O Suilleabhain | |
| 7,948,000 B2 | 5/2011 | Yang et al. | |
| 8,022,554 B2 | 9/2011 | Gupta et al. | |
| 8,093,695 B2 | 1/2012 | Cho | |
| 8,324,729 B2 | 12/2012 | Gupta et al. | |
| 8,669,664 B2 | 3/2014 | Gupta | |
| 8,941,247 B1 | 1/2015 | Gupta | |
| 9,371,221 B2 | 6/2016 | Gupta et al. | |
| 9,821,998 B2 * | 11/2017 | Gupta | .................. B81B 7/0077 |
| 10,287,162 B2 * | 5/2019 | Gupta | ................. B81C 1/00301 |
| 10,723,617 B2 * | 7/2020 | Gupta | ................. B81C 1/00301 |
| 10,913,655 B2 * | 2/2021 | Gupta | ................. H01L 41/1132 |
| 2004/0196124 A1 | 10/2004 | Majumder et al. | |
| 2005/0029666 A1 | 2/2005 | Kurihara et al. | |
| 2005/0067688 A1 | 3/2005 | Humpston | |
| 2005/0101059 A1 | 5/2005 | Yang et al. | |
| 2005/0151592 A1 | 7/2005 | Partridge et al. | |
| 2005/0168306 A1 | 8/2005 | Cohn et al. | |
| 2005/0191493 A1 | 9/2005 | Glatkowski | |
| 2005/0218488 A1 | 10/2005 | Matsuo | |
| 2005/0218530 A1 | 10/2005 | Takayanagi et al. | |
| 2005/0253240 A1 | 11/2005 | Nuechter et al. | |
| 2005/0262929 A1 | 12/2005 | Felton et al. | |
| 2005/0264140 A1 | 12/2005 | Miyazaki | |
| 2006/0006964 A1 | 1/2006 | Huang | |
| 2006/0033594 A1 | 2/2006 | Lutz et al. | |
| 2006/0060982 A1 | 3/2006 | Ikawa et al. | |
| 2006/0071734 A1 | 4/2006 | McCorquodale et al. | |
| 2006/0072874 A1 | 4/2006 | Johnston | |
| 2006/0108652 A1 | 5/2006 | Partridge et al. | |
| 2006/0194361 A1 | 8/2006 | Heck et al. | |
| 2007/0029654 A1 | 2/2007 | Sunohara et al. | |
| 2008/0160656 A1 | 6/2008 | Hagelin | |
| 2012/0132003 A1 | 5/2012 | Comi | |
| 2012/0217614 A1 | 8/2012 | Burgyan | |
| 2013/0001709 A1 | 1/2013 | Liu | |
| 2013/0142144 A1 | 6/2013 | Kim et al. | |
| 2013/0186338 A1 | 7/2013 | Tsai | |
| 2013/0194071 A1 | 8/2013 | Slogedal | |
| 2013/0264610 A1 | 10/2013 | Chen | |
| 2013/0270660 A1 | 10/2013 | Bryzek | |

* cited by examiner

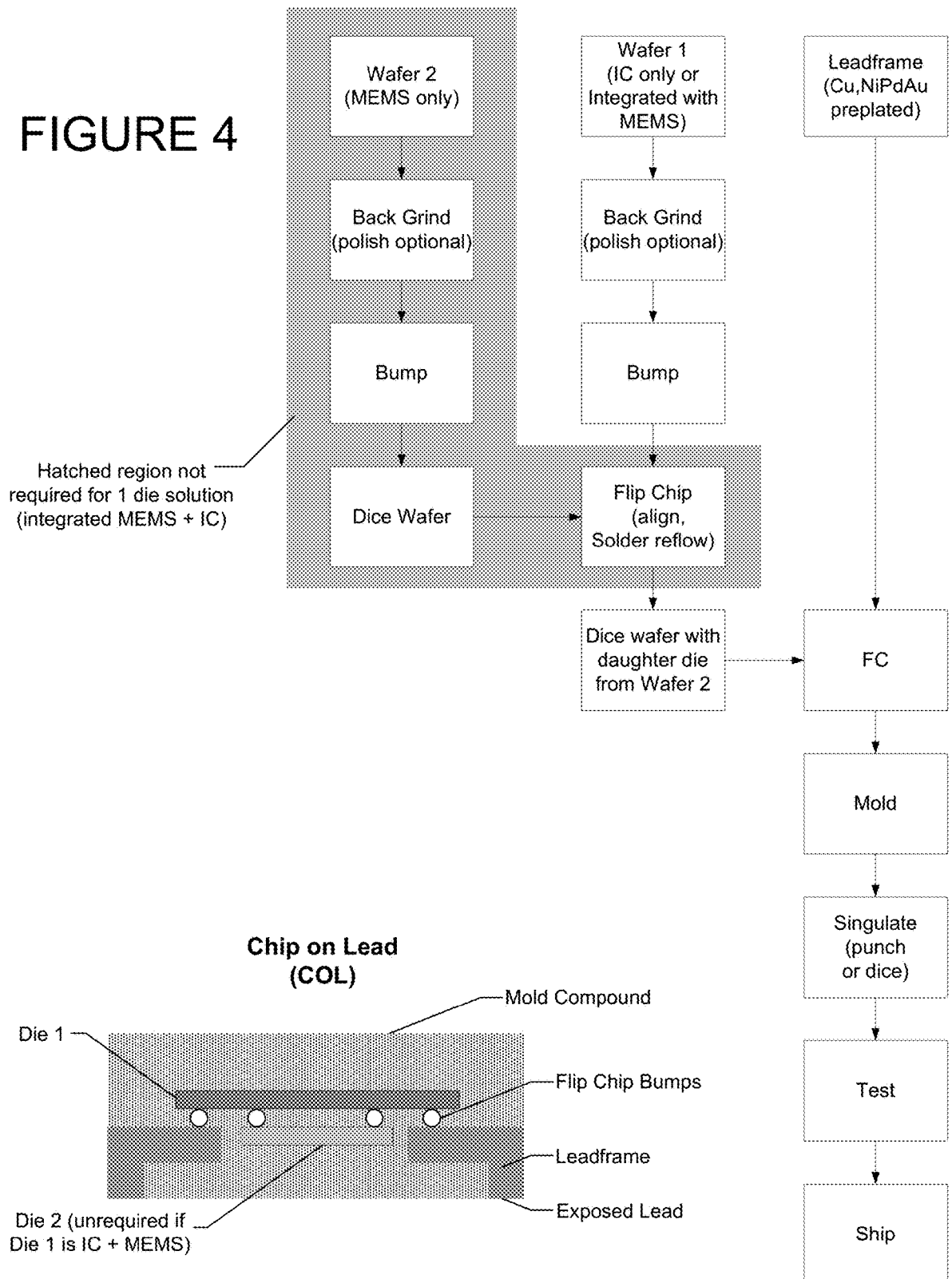

STACKED-DIE MEMS RESONATOR

CROSS-REFERENCE TO RELATED APPLICATIONS

This application is a divisional of U.S. application Ser. No. 16/903,116 filed Jun. 16, 2020, which is a divisional of U.S. application Ser. No. 16/372,745 filed Apr. 2, 2019 (now U.S. Pat. No. 10,723,617), which is a divisional of U.S. application Ser. No. 15/805,031 filed Nov. 6, 2017 (now U.S. Pat. No. 10,287,162), which is a divisional of U.S. application Ser. No. 15/187,748 filed Jun. 20, 2016 (now U.S. Pat. No. 9,821,998), which is a divisional of U.S. application Ser. No. 14/597,825 filed Jan. 15, 2015 (now U.S. Pat. No. 9,371,221), which is a divisional of U.S. application Ser. No. 14/191,978 filed Feb. 27, 2014 (now U.S. Pat. No. 8,941,247), which is a divisional of U.S. application Ser. No. 13/681,065, filed Nov. 19, 2012 (now U.S. Pat. No. 8,669,664), which is a divisional of U.S. application Ser. No. 13/151,316 filed Jun. 2, 2011 (now U.S. Pat. No. 8,324,729), which is a divisional of U.S. application Ser. No. 11/763,801 filed Jun. 15, 2007 (now U.S. Pat. No. 8,022,554), which claims priority to and benefit of U.S. Provisional Patent Application No. 60/813,874 filed on Jun. 15, 2006. Each of the above-identified patent applications is hereby incorporated herein by reference in its entirety.

TECHNICAL FIELD

Embodiments of the present invention relate generally to the fabrication of packaged timing references and particularly to a packaging configuration for micro-electromechanical systems (MEMS) and nano-electromechanical systems (NEMS) resonator systems.

BACKGROUND

Quartz resonator systems are used for timing applications in many electronic devices, including cell phones, automotive systems, game consoles, broadband communications, and almost any other digital product available. As quartz resonators decrease in size to meet the size constraints of new applications, the unit cost of quartz resonators increases while their reliability decreases. This is because some manufacturing processes become increasingly problematic with decreasing size, such as the formation and testing of a quartz resonator's hermetic seal. In addition, the reduction in size of quartz resonators may not even be practicable beyond a certain minimum size, given the mechanical constraints of the manufacturing processes currently in use.

Micro-electromechanical systems, or MEMS, are also used as resonators for electronic devices. MEMS include devices ranging in size from the micrometer to the millimeter scale. NEMS devices are similar to MEMS, but significantly smaller in size—from the sub-micrometer scale down to the nanometer scale. MEMS and NEMS are distinguished from comparably sized electronic devices, such as integrated circuits, in that MEMS and NEMS include both electrical and moving mechanical components that are generally fabricated together using micro-machining techniques.

One feature of MEMS devices in general, and MEMS resonator systems in particular, is that as MEMS resonators decrease in size, the unit cost of each MEMS resonator decreases, while the reliability of the smaller MEMS device is largely unaffected. This is because more MEMS devices can be manufactured on a given silicon substrate as the size of the MEMS device is reduced, thus defraying the per-substrate manufacturing cost over a larger number of MEMS devices. And, as long as manufacturing design rules are not exceeded, the performance and reliability of smaller MEMS devices is generally as robust as that of larger MEMS devices. Therefore, due to these cost- and performance-related reasons, there is an on-going effort to develop MEMS packaged timing references to replace quartz, ceramic, solid-state, and other types of packaged timing references in numerous electronic device applications.

Accordingly, there is a need in the art for a chip package for MEMS and NEMS resonator systems that allows for the replacement of conventional packaged timing references in existing applications and enables the use of MEMS packaged timing references in applications that are impractical for quartz and other types of packaged timing references.

SUMMARY OF ONE OF MULTIPLE DISCLOSED EMBODIMENTS

One embodiment of the present invention sets forth a packaging structure for an electromechanical resonator system. The packaging structure includes a control chip for an electromechanical resonator that comprises a micro-electromechanical system (MEMS) or nano-electromechanical system (NEMS) resonator, and a second chip that includes the electromechanical resonator and is mounted on the control chip in a stacked die configuration, wherein the second chip is thermally coupled to the control chip by a thermally conductive epoxy.

One advantage of the disclosed packaging structure is that it provides a small package footprint and/or small package thickness as well as low thermal resistance and a robust electrically conductive path between the second chip and the control chip. The disclosed package may therefore be used in lieu of alternate packaged timing references in various electronic devices due to cost, reliability, and size constraints.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4-6 illustrate exemplary embodiments of the present inventions of a stacked die configuration including a MEMS chip or die and its associated control chip or die as well as exemplary process flows for several embodiments of the packages and packaging techniques therefor. Notably, each illustration and exemplary process flow includes two die packaging embodiment (for example, the MEMS and electrical/electronic integrated circuitry disposed in/on separate substrates/dice) as well as a one die packaging embodiment wherein one die is attached to the leadframe (for example, the MEMS and electrical/electronic integrated circuitry disposed in/on the same substrate/die). Where the MEMS and electrical/electronic integrated circuitry are disposed in/on separate substrates/dice, the processing with respect to "Wafer 2" may be omitted. In this regard, the MEMS may be disposed in/on the same substrate/die as electrical/electronic integrated circuitry and/or in or on a substrate/die that is not packaged (or attached to the leadframe) with the MEMS.

For clarity, identical reference numbers have been used, where applicable, to designate identical elements that are common between figures. It is contemplated that features of one embodiment may be incorporated in other embodiments without further recitation.

DETAILED DESCRIPTION

Embodiments of the invention contemplate stacked die package configurations for a MEMS resonator and its associated control chip that provide small package footprint and/or low package thickness. These stacked die package configurations further provide low thermal resistance and a robust electrically conductive path between the resonator chip and the control chip. Stacked die configurations include chip-on-lead (COL), chip-on-paddle (COP), and chip-on-tape (COT) packages. MEMS resonators contained in COL, COP, or COT stacked die packages, according to embodiments of the invention, may be beneficially used in lieu of quartz, ceramic, solid-state and other types of packaged timing references, due to the cost, reliability, and size constraints of these packaged timing references. In addition, the stacked die packages provided herein enable "drop-in" replacement of quartz packaged timing references used in existing applications, i.e., the form-factor and lead configuration of a packaged MEMS resonator can be made essentially identical to quartz-based packaged timing references. Thus, the replacement of a quartz packaged timing reference in an electronic device with a functionally equivalent MEMS packaged timing reference is transparent to the architecture of the device, and therefore no modifications to the device are necessary to accommodate the MEMS resonator package.

Chip-On-Lead Stacked Die

Figure 1A:
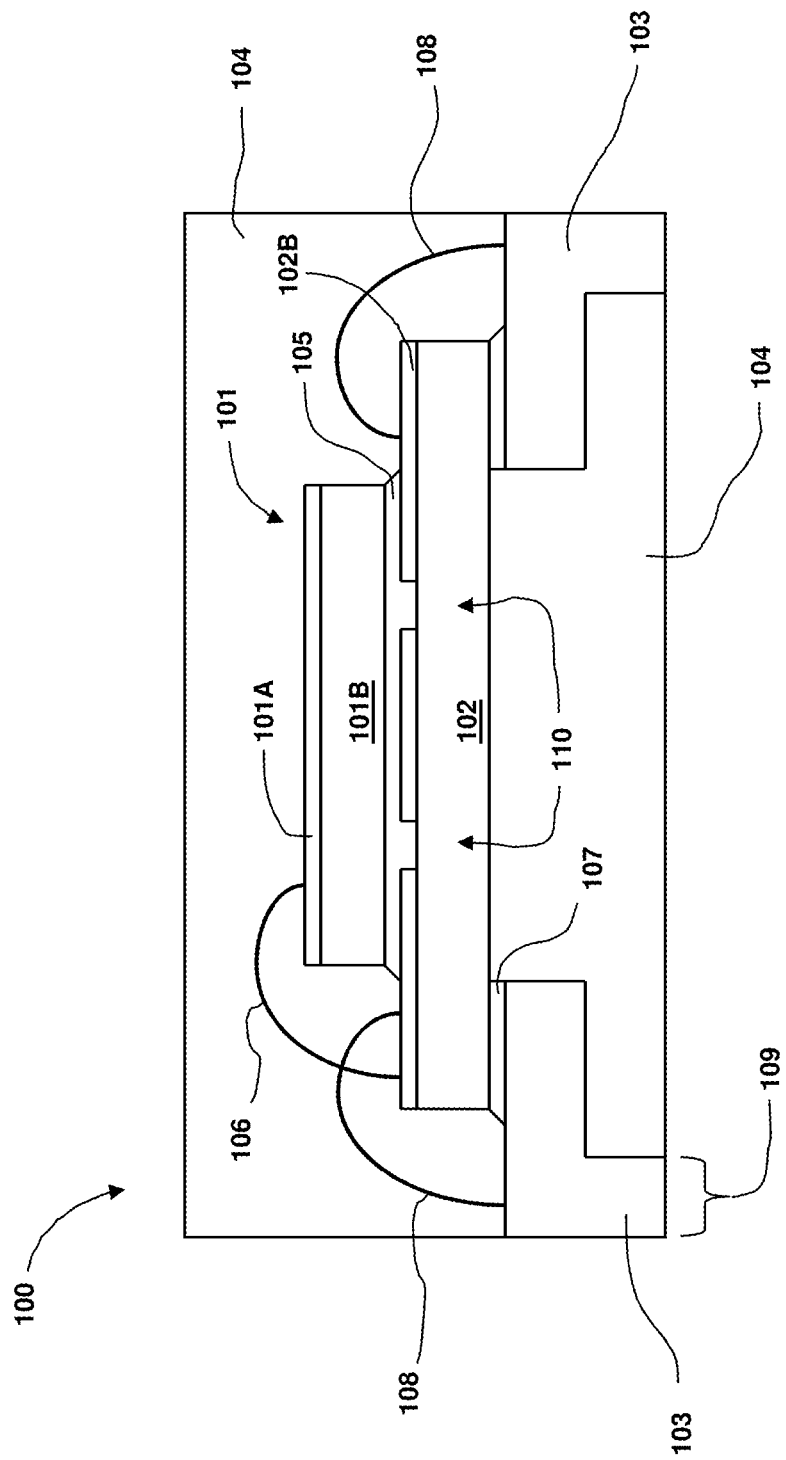
FIG. 1A illustrates a schematic cross-sectional view of a stacked die COL package configuration, according to an embodiment of the invention.

FIG. 1A illustrates a schematic cross-sectional view of a stacked die COL package configuration, according to an embodiment of the invention. COL package 100 includes a MEMS chip 101, a control chip 102, and a plurality of leads 103, which are assembled and enclosed inside a mold compound 104. MEMS chip 101 includes a MEMS device layer 101A and a bulk layer 101B and is mounted onto control chip 102 with a conductive epoxy 105, as shown. A fully formed MEMS resonator (not shown) is contained in MEMS device layer 101A and is electrically coupled to control chip 102 by a plurality of bonding wires 106, thereby allowing control chip 102 to power, control, and sense the output of the MEMS resonator. In the example illustrated in FIG. 1A, control chip 102 is a CMOS chip, but other micro-electronic control chips are also contemplated. Control chip 102 is mounted onto the leads 103. An electrically non-conductive epoxy 107 bonds control chip 102 to leads 103, and electrically insulates control chip 102 from leads 103. A plurality of bonding wires 108 electrically couples control chip 102 to the appropriate leads 103 for the proper operation of control chip 102, e.g., power, ground, resonator output signal, etc. Each lead 103 has an electrical contact surface 109 exposed on the bottom of COL package 100 to facilitate connection to a board (not shown) contained in a parent electronic device.

Because the performance of MEMS resonators is temperature sensitive, control chip 102 contains a temperature sensor to compensate for temperature changes experienced by the MEMS resonator contained in the MEMS device layer 101A. Proper operation of the MEMS resonator therefore depends on a short thermal path between the temperature sensor in control chip 102 and the MEMS resonator itself. Conductive epoxy 105 serves to mechanically bond MEMS chip 101 onto control chip 102, while thermally coupling MEMS chip 101 to control chip 102. In addition, conductive epoxy 105 may electrically couple MEMS chip 101 with control chip 102 via apertures 110 formed through passivation layer 102B of control chip 102. Passivation layer 102B is an electrically insulating layer formed as a top layer of control chip 102 to protect the micro-electronic devices contained therein. Before MEMS chip 101 is bonded onto control chip 102, apertures 110 are formed in passivation layer 102B by lithographic methods known in the art. Conductive epoxy 105 then forms one or more conductive paths between the MEMS chip 101 and control chip 102, as shown. These conductive paths prevent any potential difference from developing between MEMS chip 101 and control chip 102. As used herein, "conductive" is defined as being sufficiently dissipative of electric charge to act as a conductive path for a static electric charge, i.e., having a resistivity of no more than about 1 to 10 Megohm-cm.

Maximizing the surface area of MEMS chip 101 and control chip 102 that are in contact with conductive epoxy 105 enhances the thermal and electrical coupling provided by conductive epoxy 105. In the example shown in FIG. 1A, the entire backside of MEMS chip 101 and most of the surface of control chip 102 are in contact with conductive epoxy 105. In addition, the thermal and electrical conductivity of conductive epoxy 105 may be enhanced by the presence of conductive particles, such as silver particles, included therein. Such thermally conductive epoxies are known in the art for application to the backside of COP packages for CMOS and other chips, but are typically not used as stacking epoxies due to their inherent rigidity and/or abrasiveness. To address this concern, conductive epoxy 105 is selected to have a coefficient of thermal expansion that is relatively close to that of silicon (Si), to minimize the mechanical stress induced by changes in temperature of the MEMS resonator and control chip 102, which in turn reduces the force imparted on passivation layer 102B. In this way, damage to passivation layer 102B and control chip 102 is much less likely to occur when COL package 100 undergoes significant temperature changes. In one embodiment, conductive epoxy 105 has a coefficient of thermal expansion between about $2 \times 10^{-6}/°C$. and about $170 \times 10^{-6}/°C$. Examples of electrically and thermally conductive epoxies that may be used as conductive epoxy 105 include Hysol® QMI 505MT and Hysol® QMI 519.

In addition to COL package 100, other stacked die COL packages are contemplated for forming a compact and robust MEMS resonator package. For example, the MEMS chip 101 may be mounted to leads 103 and control chip 102 may then be mounted onto MEMS chip 101. In another example, MEMS chip 101 and control chip 102 may only be partially stacked, or positioned in an asymmetrical configuration.

Figure 1B:
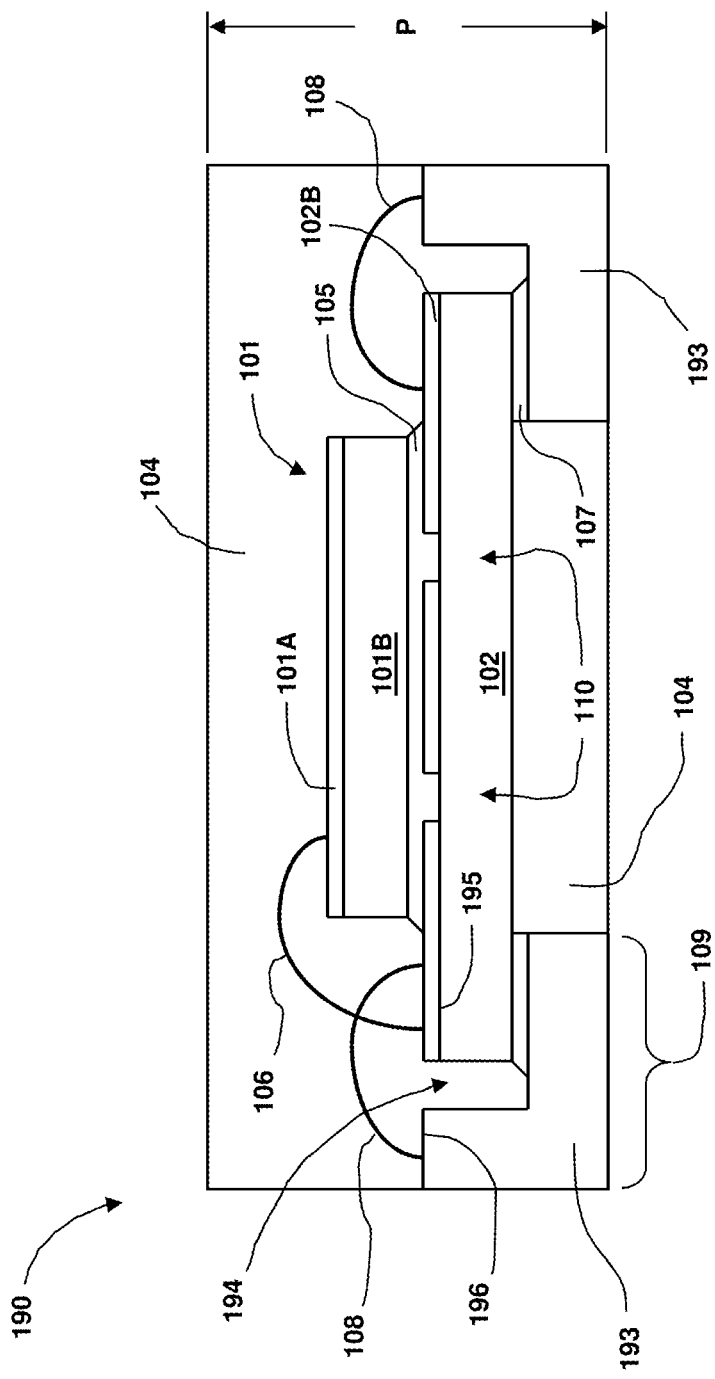
FIG. 1B illustrates a schematic cross-sectional view of a stacked die COL package configuration with a downset chip, according to another embodiment of the invention.

FIG. 1B illustrates another stacked die COL configuration contemplated by embodiments of the invention. COL package 190 is mounted to leads 193 in a downset chip configuration, as shown, and generally shares a number of substantially similar elements with COL package 100, illustrated in FIG. 1A. Identical reference numbers have been used, where applicable, to designate the common elements between COL package 100 and COL package 190. Advantages of COL package 190 include a lower cross-sectional profile and a broader process window for wirebonding than can be provided by a standard COL package. Leads 193 are fabricated with an inset cavity 194, and MEMS chip 101 and control chip 102 are positioned inside inset cavity 194 when mounted onto leads 193. In this way, the cross-sectional profile, or thickness, P, of COL package 190 is substantially reduced compared to COL package 100. In addition, the wirebonding process is more easily and reliably performed on COL package 190 than COL package 100 for two reasons. First, an upper surface 195 of control chip 102 can be substantially aligned with upper surface 196 of leads 193, which may decrease the time necessary to complete the wirebonding process. Second, leads 193 generally form a more rigid support structure for control chip 102 during the wirebonding process than the more cantilevered configuration of leads 103 in COL package 100, thereby increasing the process window of the wirebonding process. An alternate COL package option includes unetched leads, whereby the chips are neither cantilevered nor downset.

Figure 1C:
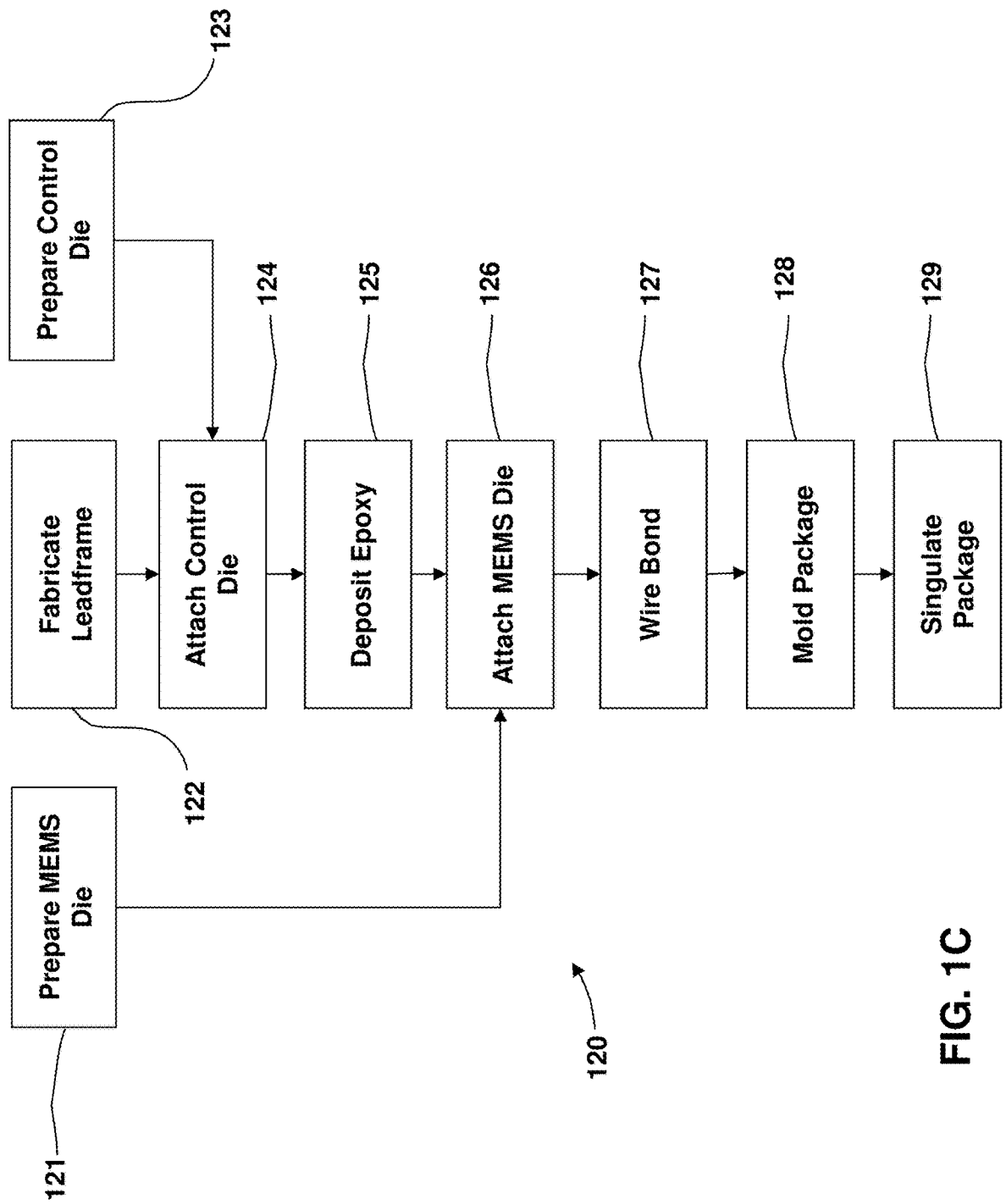
FIG. 1C illustrates a flow chart outlining a process sequence for producing the COL package as illustrated in FIG. 1A.

FIG. 1C illustrates a flow chart outlining a process sequence 120 for producing COL package 100 as illustrated in FIG. 1A. Process steps 121-123 may be carried out in parallel, as shown.

In step 121, a MEMS device die substantially similar to MEMS chip 101 in FIG. 1A is prepared for packaging. First, a MEMS device die containing a MEMS resonator is fabricated on a substrate using deposition, etching, and lithographic methods commonly known in the art. A plurality of dice may be fabricated on the substrate simultaneously. Next, a thinning process, such as a backgrind process, is performed on the substrate, followed by an optional polishing process. Lastly, the MEMS device die is diced from the substrate using a process similar to that for singulating integrated circuit (IC) chips from a silicon wafer.

In step 122, a leadframe containing leads substantially similar to leads 103 in FIG. 1A is fabricated. The leadframe is formed from a plated metallic substrate, such as copper plated with NiPdAu, using etching and lithographic methods commonly known in the art. Similar to the fabrication of a MEMS device die described in step 121, the leads for a plurality of COL packages may be fabricated from a single substrate at once.

In step 123, a control die similar to control chip 102 is prepared for packaging. The control die, which is a conventional integrated circuit die, is fabricated and prepared via a process similar to step 121, i.e., deposition, etching, lithography, thinning, and dicing are used to produce one or more singulated control dice from a silicon substrate. In addition, the control die is further prepared for packaging by the screen printing of an electrically non-conductive epoxy on the back of the silicon substrate prior to dicing. Alternatively, the electrically non-conductive epoxy may instead be deposited onto the leadframe directly as part of fabricating the leadframe in step 122.

In step 124, the control die is attached to the leadframe with the electrically non-conductive epoxy. As noted above, the electrically non-conductive epoxy may be screen printed to the backside of the control die in step 123 or applied to the leadframe in step 122.

In step 125, a conductive epoxy, which is substantially similar to conductive epoxy 105 in FIG. 1A, is deposited in preparation for attaching the MEMS die onto the control die in a stacked die configuration. The conductive epoxy may be deposited onto the backside of the MEMS die or onto the requisite surfaces of the control die.

In step 126, the MEMS die is attached to the control die in a stacked die configuration using methods commonly known in the art.

In step 127, the MEMS die, the control die, and the leadframe are wirebonded as required to electrically couple the two dice to each other and to the leadframe. Because wirebonding the MEMS die and the control die involves pressing a ball bond or other wire onto a substantially cantilevered substrate, i.e., the leadframe, the process window for the wirebonding process may be substantially reduced compared to conventional wirebonding processes. For example, the force required to produce good electrical contact may be relatively close to the force required to plastically deform, and therefore damage, portions of the leadframe or control die. Alternatively, a leadframe having a downset chip configuration may be used to address this issue.

In step 128, the stacked die package is enclosed in a protective mold compound substantially similar to mold compound 104 in FIG. 1A.

In step 129, the stacked die package is singulated out of the leadframe substrate using methods commonly known in the art.

Other sequences in addition to process sequence 120 are contemplated for producing COL package 100. For example, the MEMS die prepared in step 121 may be attached and wirebonded to the control die before the control die is attached to the leadframe in step 124. In another example, part of step 121, i.e., MEMS die preparation, may include the deposition of conductive epoxy onto the backside of the MEMS substrate prior to dicing thereof. In this case, deposition of the epoxy may include screen printing or other methods known in the art.

The stacked die COL structure of COL package 100 is a compact, robust packaging structure for a MEMS resonator and control chip, made possible by the electrical and thermal conductive paths between MEMS chip 101 and control chip 102 that are formed by conductive epoxy 105. Hence, the use of an electrically and/or thermally conductive epoxy having a coefficient of thermal expansion substantially the same as silicon enables the packaging of a MEMS chip and a control chip as a COL stacked die structure. With a stacked die structure, COL package 100 can be configured with a footprint that is quite small relative to the size of MEMS chip 101 and control chip 102. Because of its inherently small footprint, COL package 100 may be used as a drop-in replacement for applications utilizing small quartz resonator packages, such as 2.5 mm×2 mm QFN packages, among others. In addition, the stacked die structure of COL package 100 also allows the packaging of MEMS resonators with packages that have significantly smaller footprints than packaged timing references known in the art and smaller footprints than MEMS resonators packaged in standard chip packages. These smaller packages enable the use of a MEMS resonator packaged timing reference in developing applications requiring a thickness of less than 350 µm and/or a footprint of less than 1.6 mm×2.0 mm, which are impracticable for other types of packaged timing references, such as solid-state, ceramic, or quartz packaged timing references.

The ability to reduce the size of a MEMS resonator package is beneficial for other reasons as well. Smaller packages are inherently more reliable, since they have less surface area for moisture ingress to contaminate epoxies and metal joints. In addition, smaller packages are subject to less thermally induced stress between the package and the board onto which the package is mounted or soldered. This is because the thermally induced stress produced between joined objects consisting of dissimilar materials is proportional to size of the objects. Further, smaller packages are more rigid, i.e., a given quantity of stress causes less strain and deflection of internal components in a smaller package than on those in a larger package. Hence, a smaller package undergoes less thermally induced stress and is also less sensitive to such stress. Because MEMS devices are very sensitive to strain and deflection, their reliability and accuracy is substantially improved when the package size is minimized.

Chip-On-Paddle Stacked Die

Figure 2A:
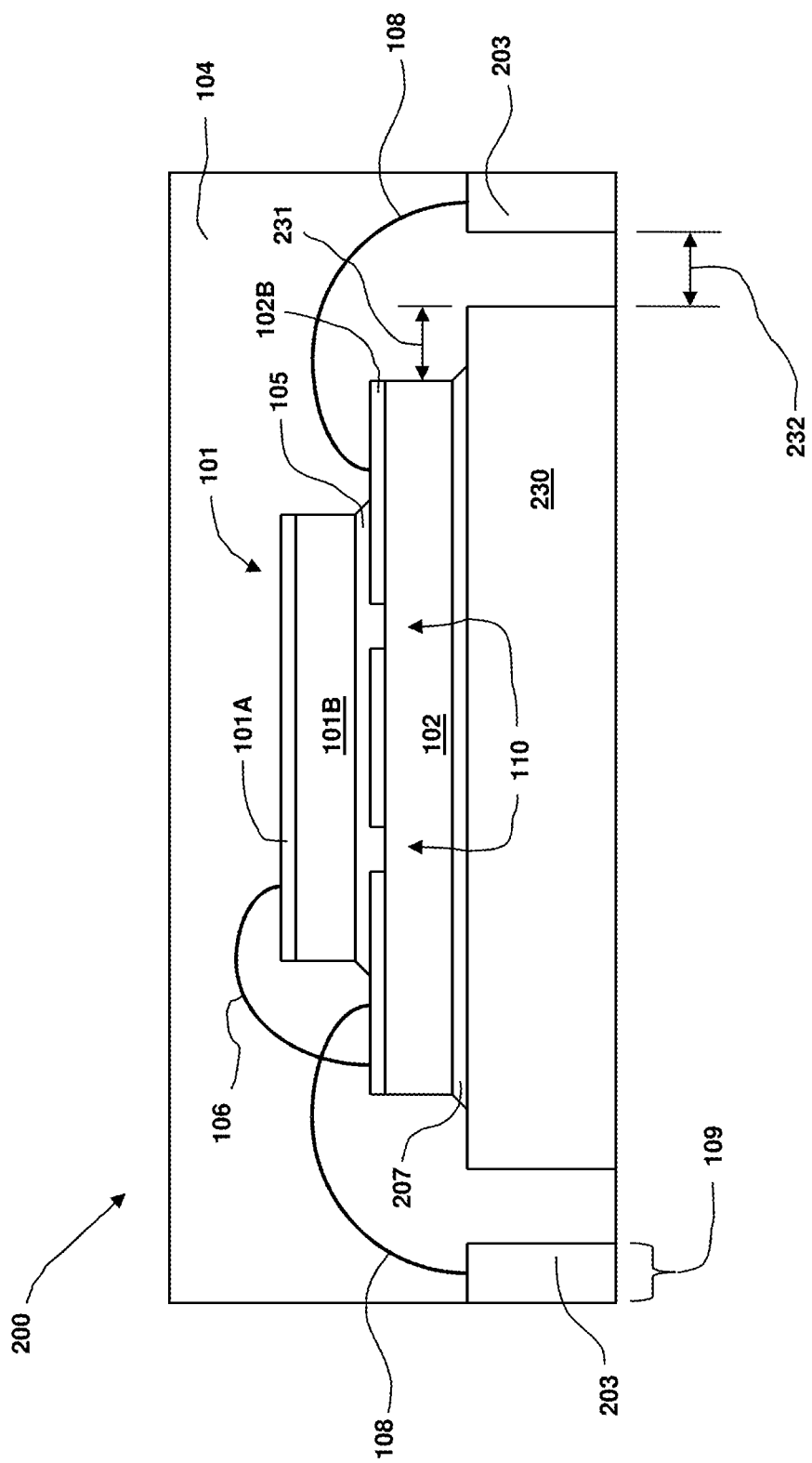
FIG. 2A illustrates a schematic cross sectional view of a stacked die COP package configuration, according to an embodiment of the invention.

FIG. 2A illustrates a schematic cross sectional view of a stacked die COP package configuration, according to an embodiment of the invention. COP package 200 shares a number of substantially similar elements with COL package 100 illustrated in FIG. 1A. Identical reference numbers have been used, where applicable, to designate the common elements between COL package 100 and COP package 200.

As shown in FIG. 2A, MEMS chip 101 is mounted on control chip 102 with conductive epoxy 105, and both chips are wirebonded to each other and to a plurality of leads. As described above in conjunction with FIG. 1A, conductive epoxy 105 electrically couples MEMS chip 101 to control chip 102 via apertures 110, mechanically bonds the chips, and thermally couples the chips. In contrast to leads 103 of COL package 100, leads 203 do not structurally support control chip 102 and MEMS chip 101. Instead, control chip 102 is mounted on and supported by a die paddle 230, which is electrically and physically isolated from one or more of the leads 203 as shown.

Die paddle 230 serves as the primary region of thermal input and output for COP package 200. Because of this, a thermally conductive and electrically conductive epoxy 207 may be used to bond control chip 102 to die paddle 230. Alternatively, epoxy 207 may also be electrically insulative for some applications. Die paddle 230 extends beyond the edges of control chip 102, as shown, producing an overlap region 231. Overlap region 231 is a necessary feature of COP package 200 due to design rules known in the art regarding the structure of COP packages for IC or other chips. Also, because leads 203 and die paddle 230 are formed from what is initially a single continuous metallic substrate, one or more of leads 203 are separated from die paddle 230 by a minimum gap 232, according to standard design rules known in the art for the leadframe etch process. Etch design rules, such as the maximum aspect ratios of etched features, are necessary for the reliable separation of leads 203 from the die paddle 230 during the etch process. When such design rules are violated, minimum gap 232 may be incompletely formed, and die paddle 230 may not be electrically isolated as necessary from one or more of leads 203, thereby rendering the MEMS resonator in MEMS chip 101 inoperable. It is noted that, for clarity, overlap region 231 and minimum gap 232 have not been drawn to scale in FIG. 2A and are generally much larger relative to control chip 201 than shown.

It is known in the art that, for a given chip footprint, COP packages are inherently larger than COL packages. This is due to overlap region 231 and minimum gap 232, which make up a significant portion of COP package footprint, and therefore largely dictate the minimum size of a COP package, regardless of the sizes of the MEMS chip 101 and the control chip 102. However, embodiments of the invention contemplate a stacked die COP package for MEMS resonators to better facilitate the drop-in replacement of existing quartz resonator applications. Packaged quartz resonators for existing applications may be relatively large, e.g., 5 mm×7 mm, and therefore do not require the smaller footprint benefit of a COL package, as described above in conjunction with FIG. 1A.

Figure 2B:
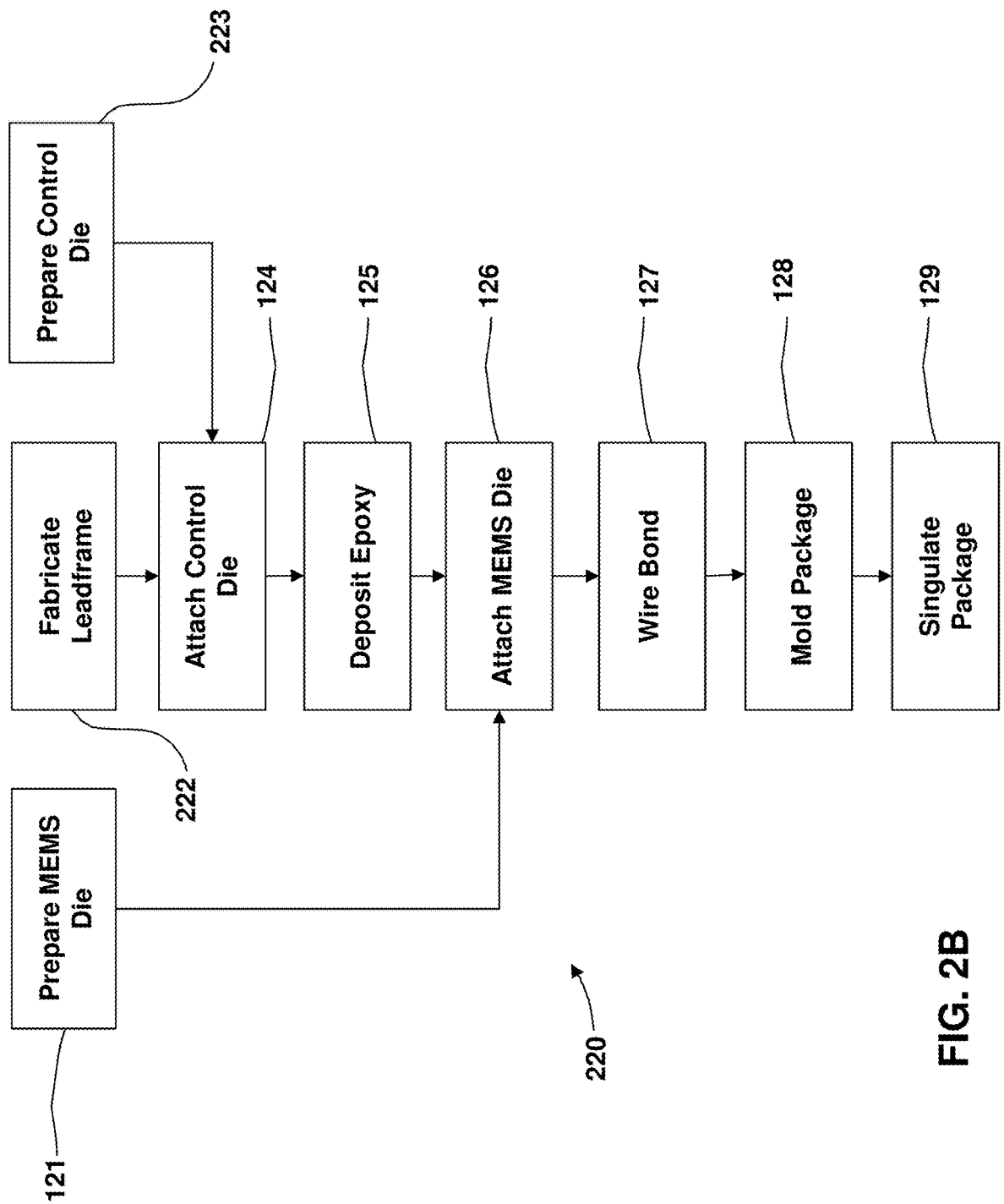
FIG. 2B illustrates a flow chart outlining a process sequence for producing the COP package as illustrated in FIG. 2A.

FIG. 2B illustrates a flow chart outlining a process sequence 220 for producing COP package 200 as illustrated in FIG. 2A. A number of the process steps for process sequence 220 are substantially similar to the corresponding process steps in process sequence 120, described above, and are therefore provided with identical reference numbers, where applicable.

In step 121, a MEMS device die substantially similar to MEMS chip 101 in FIG. 1A is prepared for packaging. This process step is described above in conjunction with FIG. 1C.

In step 222, a leadframe substantially similar to the leadframe containing leads 203 in FIG. 2A is fabricated. With the exception of the particular features formed into the metallic substrate, this process step is substantially identical to step 122, described above in conjunction with FIG. 1C. Because the features formed into a leadframe substrate for a COP package, i.e., the die paddle and leads, are easier to fabricate than the more complicated features of a COL package leadframe, conventional etching and lithographic methods commonly known in the art may be used for step 222.

In step 223, a control die similar to control chip 102 is prepared for packaging. This process step is substantially similar to step 123, described above in conjunction with FIG. 1C, except that the electrically non-conductive epoxy may also be selected to be electrically and/or thermally conductive. In this way, control chip 102 is thermally coupled to die paddle 230, thereby allowing die paddle 230 to act as the primary region of thermal input and output for COP package 200. Electrically conductive epoxy allows the control chip 102 to be electrically coupled to the die paddle 230.

In step 124, the control die is attached to the leadframe with the thermally conductive, electrically conductive epoxy. This process step is described above in conjunction with FIG. 1C. Alternately, the conductive epoxy could be non-electrically conductive.

In step 125, a conductive epoxy, is deposited in preparation for attaching the MEMS die onto the control die in a stacked die configuration. This process step is also described above in conjunction with FIG. 1C.

In step 126, the MEMS die is attached to the control die in a stacked die configuration using methods commonly known in the art. This process step is also described above in conjunction with FIG. 1C.

In step 127, the MEMS die, the control die, and the leadframe are wirebonded as required to electrically couple the two dice to each other and to the leadframe. The wirebonding process for COP packaging is commonly known in the art, and is further described above in conjunction with FIG. 1C.

In step 128, the stacked die package is enclosed in a protective mold compound substantially similar to mold compound 104 in FIG. 1A. This process step is described above in conjunction with FIG. 1C.

In step 129, the stacked die package is singulated out of the leadframe substrate using methods commonly known in the art. This process step is also described above in conjunction with FIG. 1C.

Other sequences in addition to process sequence 220 are contemplated for producing COP package 200. For example, the MEMS die prepared in step 121 may be attached to the control die before the control die is attached to the leadframe in step 124. In another example, part of step 121, i.e., MEMS die preparation, may include the deposition of conductive epoxy onto the backside of the MEMS substrate prior to dicing thereof.

Chip-On-Tape Stacked Die

Figure 3A:
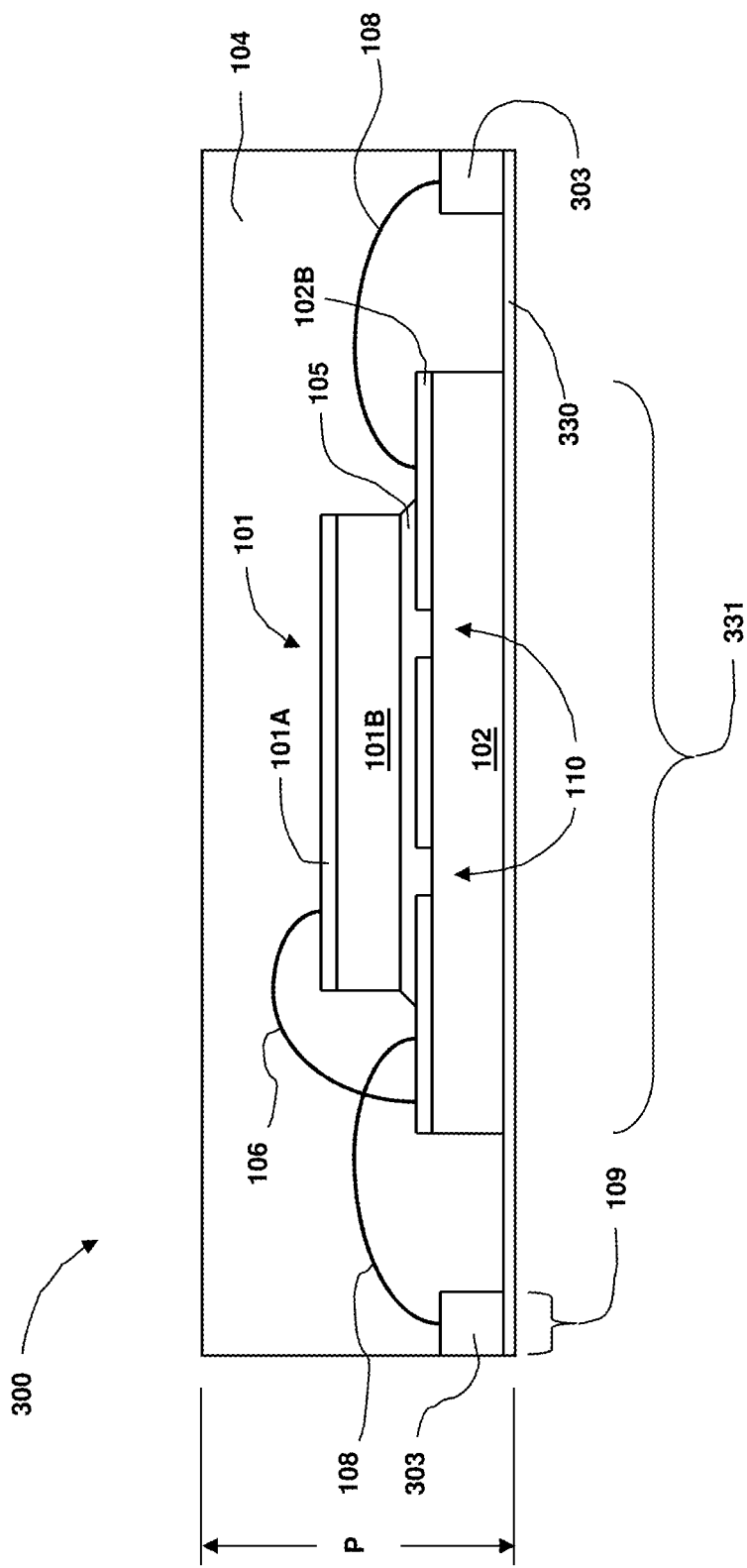
FIG. 3A illustrates a schematic cross sectional view of a stacked die COT package configuration, according to an embodiment of the invention.

FIG. 3A illustrates a schematic cross sectional view of a stacked die COT package configuration, according to an embodiment of the invention. COT package 300 shares a number of substantially similar elements with COL package 100 illustrated in FIG. 1A. Therefore, identical reference numbers have again been used, where applicable, to designate the common elements between COL package 100 and COT package 300.

As shown in FIG. 3A, MEMS chip 101 is mounted on control chip 102 with conductive epoxy 105, and both chips are wirebonded to each other and to leads 303. As described above in conjunction with FIG. 1A, conductive epoxy 105 electrically couples MEMS chip 101 to control chip 102 via apertures 110, mechanically bonds the chips, and thermally couples the chips. In contrast to COL package 100 and COP package 200, control chip 102 and leads 303 are mounted onto an adhesive tape 330, thereby enabling a lower cross-sectional profile, P, for COT package 300 than is practicable for COL and COP MEMS resonator packages. In this way, the cross-sectional profile P of COT package may be 350 μm or less. The control chip 102 may be bonded directly to the adhesive tape 330, or an epoxy layer may be deposited between the control chip 102 and the adhesive tape 330. Positioning leads 303 and control chip 102 as shown on adhesive tape 330 electrically and physically isolates leads 303 from control chip 102. Control chip 102 and MEMS chip 101 are wirebonded to each other and to leads 303 as shown. In some applications, adhesive tape 330 is removed after mold compound 104 is formed around MEMS chip 101 and control chip 102, thereby exposing an exposed chip surface 331 of control chip 102 and electrical contact surface 109 of leads 303. In other applications, tape 330 is left in place and electrical contact is made to electrical contact surface 109 via metallic layers deposited on adhesive tape 330.

Figure 3B:
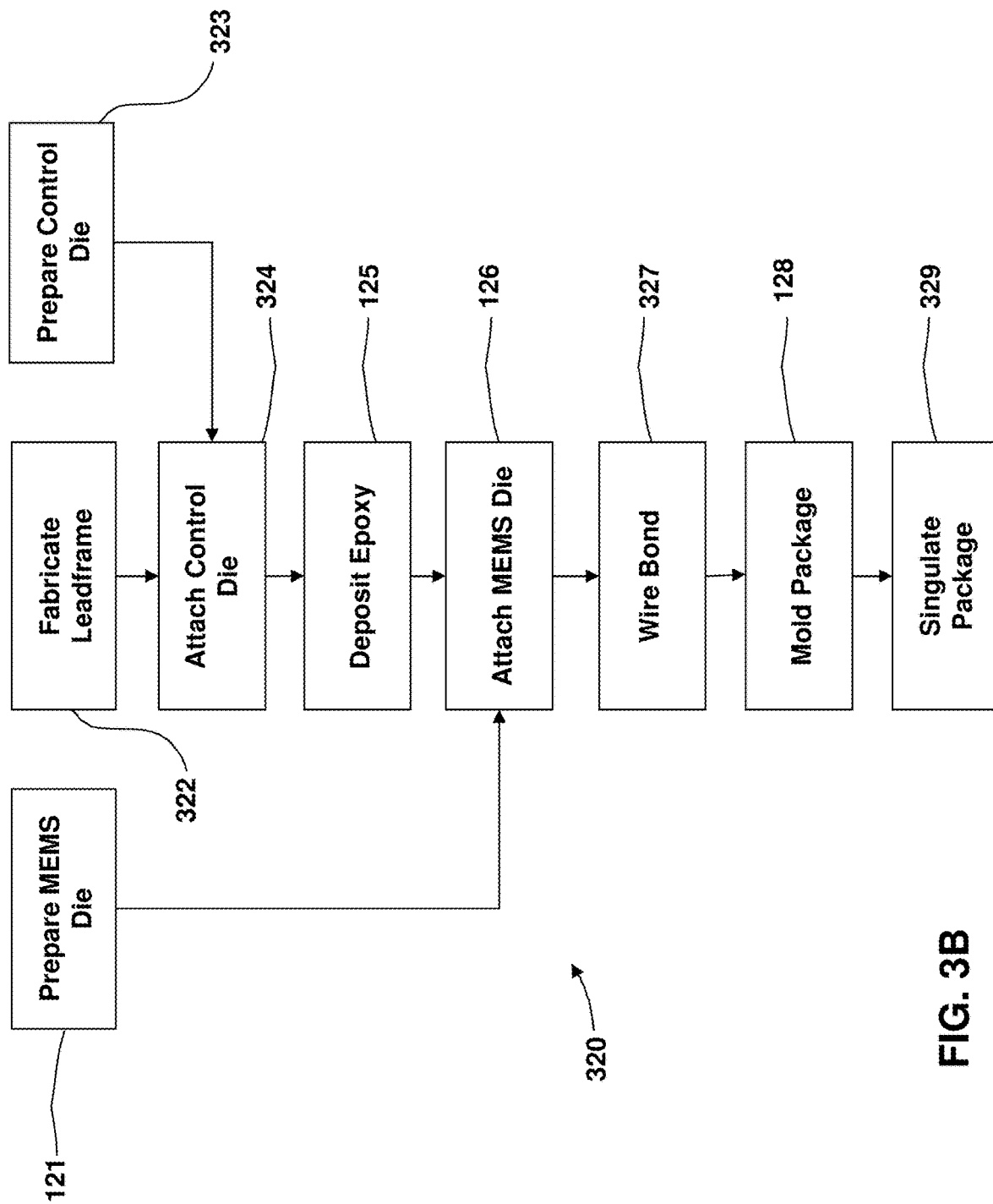
FIG. 3B illustrates a flow chart outlining a process sequence for producing the COT package as illustrated in FIG. 3A.

FIG. 3B illustrates a flow chart outlining a process sequence 320 for producing COT package 300 as illustrated in FIG. 3A. A number of the process steps for process sequence 320 are substantially similar to the corresponding process steps in process sequence 120, described above, and are therefore provided with identical reference numbers, where applicable.

In step 121, a MEMS device die substantially similar to MEMS chip 101 in FIG. 1A is prepared for packaging. This process step is described above in conjunction with FIG. 1C.

In step 322, a leadframe substantially similar to the leadframe containing leads 303 in FIG. 3A is fabricated. With the exception of the particular features formed into the metallic substrate, this process step is substantially identical to step 122, described above in conjunction with FIG. 1C.

In step 323, a control die similar to control chip 102 is prepared for packaging. This process step is substantially similar to step 123, described above in conjunction with FIG. 1C, except that the epoxy applied to the backside of the silicon substrate may be either electrically conductive or electrically non-conductive, depending on the application for COT package 300.

In step 324, the control die for the COT package are attached to an adhesive tape substantially similar to adhesive tape 330 in FIG. 3A.

In step 125, a conductive epoxy is deposited in preparation for attaching the MEMS die onto the control die in a stacked die configuration. This process step is described above in conjunction with FIG. 1C.

In step 126, the MEMS die is attached to the control die in a stacked die configuration using methods commonly known in the art. This process step is also described above in conjunction with FIG. 1C.

In step 327, the MEMS die, the control die, and the leads are wirebonded as required to electrically couple the two dice to each other and to the leads mounted on the adhesive tape using wirebonding processes for COT packaging commonly known in the art.

In step 128, the stacked die package is enclosed in a protective mold compound substantially similar to mold compound 104 in FIG. 1A. This process step is described above in conjunction with FIG. 1C.

In step 329, the stacked die package is singulated out of the leadframe using methods commonly known in the art.

Other sequences in addition to process sequence 320 are contemplated for producing COT package 300. For example, a MEMS chip may first be mounted onto a control chip as described in step 126, then the control chip may be mounted onto the adhesive tape as described in step 324. In addition, the MEMS chip may be wirebonded to the control chip before the control chip is mounted onto the adhesive tape.

Figure 5:
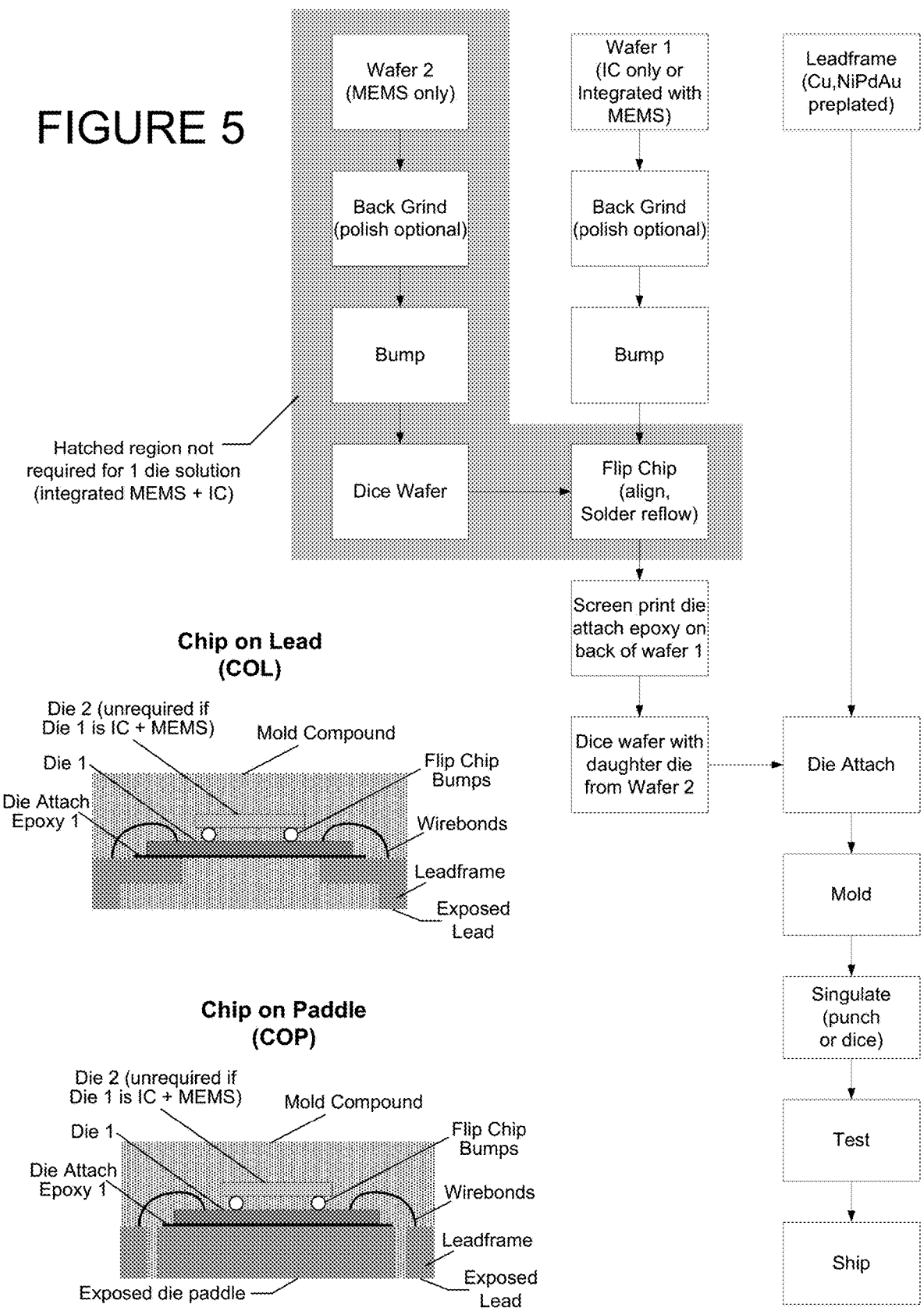
Figure 6:
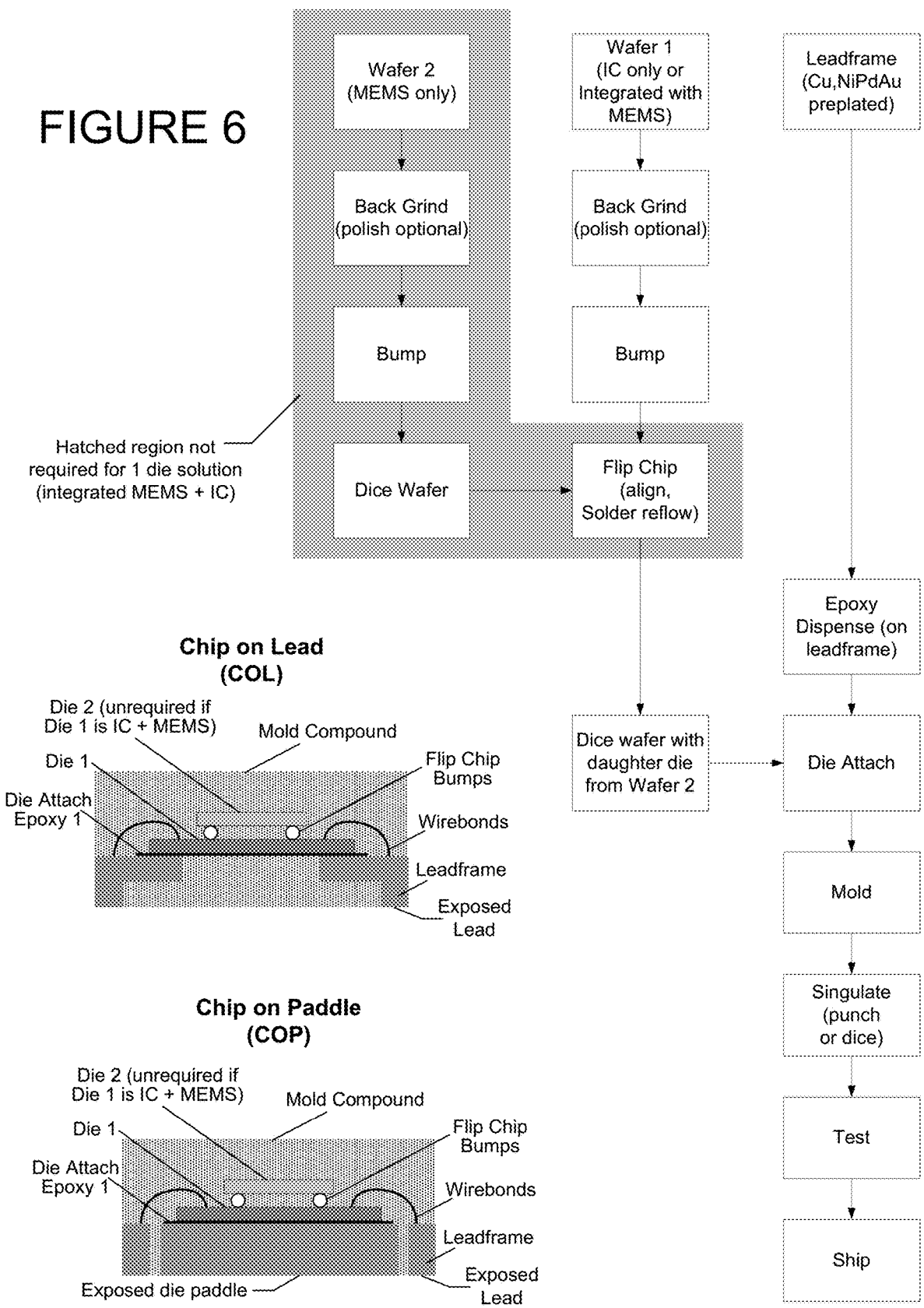

FIGS. 4-6 illustrate exemplary embodiments of the present inventions of a stacked die configuration including a MEMS chip and its associated control chip as well as exemplary process flows for several embodiments of the packages and packaging techniques therefor. Notably, the materials for certain structures are identified in the exemplary embodiments and exemplary process flows of FIGS. 4-6. For example, the leadframe is identified as being "Copper, NiPdAu preplated" and the die attach is identified as "Epoxy". Such materials are merely exemplary. Other materials are suitable. Indeed, all materials, whether now known or later developed which may be implemented are intended to fall within the scope of the present inventions.

For example, the die attach epoxy 1 and/or die attach epoxy 2 may be any type of adhesive. Further, such adhesive may also enhance the thermal transfer characteristics and/or the electrical conductivity between the two structures (for example, between die 1 and die 2).

Moreover, certain aspects of the steps of the exemplary process flows of FIGS. 4-6 are identified as optional (for example, "polish optional"). Clearly, other steps of the flows are optional or unnecessary to the package and packaging techniques of the present inventions. For example, the process flow steps of "Test" and "Ship" are unnecessary to implement the package and packaging techniques of the present inventions. Thus, neither the step nor the order of the steps outlined in the exemplary process flows should be interpreted as mandatory and/or performed exclusively in the particular manner/order.

In addition, the process flow step of "Back Grind" may be unnecessary where, for example, the thickness of the wafer is suitable for packaging (for example, where the thickness of the processed wafers is sufficiently "thin" to accommodate the package and/or packaging constraints (if any) without thinning via, for example, back grinding). In this regard, the wafer(s) may be processed without back grinding or polishing (for example, via chemical mechanical polishing techniques).

Notably, the wafer thinning process step (for example, "Back Grind"), where employed, may be implemented using a dice before grind technique. In this embodiment, the wafer thinning process may first partially dice the wafer(s) and thereafter grind back the backside of the wafer(s) until the dice are detached. In this way, the individual die/dice (for example, electrical/electronic integrated circuitry substrate/die and/or the MEMS substrate/die) are singulated and available for further processing.

While the foregoing is directed to embodiments of the present invention, other and further embodiments of the invention may be devised without departing from the basic scope thereof, and the scope thereof is determined by the claims that follow.

What is claimed is:

1. A multi-die package comprising:
a control die having a first surface;
electrically conductive structures extending perpendicularly from the first surface of the control die to a first exterior surface of the multi-die package to enforce a structural offset of the control die from the first exterior surface;
a microelectromechanical system (MEMS) die mounted to the control die;
at least one electrical connection between the MEMS die and the control circuit die to provide for electrical communication therebetween; and
encapsulation material disposed between and in contact with the electrically conductive structures and encapsulating the MEMS die;
wherein the control die further comprises circuitry to sense a temperature of the MEMS die and to generate correction information to adjust an electrical output of the MEMS die in dependence on sensed temperature;
wherein the first surface and the MEMS die are mounted in a manner coupled by a thermally-conductive material, so as to place the circuitry to sense the temperature and a MEMS structure with a movable element in thermal communication with one another.

2. The multi-die package of claim 1 wherein the control die comprises a complementary metal oxide semiconductor (CMOS) die.

3. The multi-die package of claim 1 wherein the electrically conductive structures are part of a common lead frame.

4. The multi-die package of claim 1 wherein the electrically conductive structures form at least part of a lateral surface of the multi-die package, the lateral surface being perpendicular to the first surface of the control die and perpendicular to the first exterior surface.

5. The multi-die package of claim 1 wherein the thermally-conductive material comprises an epoxy having silver particles.

6. The multi-die package of claim 1 wherein the at least one electrical connection comprises bondwires that electrically couple the MEMS die to the control die.

7. The multi-die package of claim 1 wherein the at least one electrical connection comprises solder bumps that electrically couple the MEMS die to the control die.

8. The multi-die package of claim 1 wherein the MEMS die comprises a resonant MEMS structure and the control die comprises circuitry to output a time-varying drive signal to the MEMS die to effect resonant motion of the resonant MEMS structure.

9. The multi-die package of claim 1 wherein the MEMS die comprises a resonant MEMS structure and said circuitry is to compensate for a frequency output of the MEMS resonant structure according to temperature sensed by said circuitry.

10. The multi-die package of claim 1 wherein the encapsulation material is disposed within a three-dimensional region of the multi-die package between the electrically conductive structures and between the first surface of the control die and the first exterior surface of the multi-die package.

11. The multi-die package of claim 1 wherein the MEMS die is flip-chip mounted to the first surface of the control die via electrically conductive elements.

12. A method of fabricating a multi-die package having a microelectromechanical system (MEMS) die and a control die having a first surface, wherein the control die comprises circuitry to sense a temperature of the MEMS die and to generate correction information to adjust an electrical output of the MEMS die in dependence on sensed temperature, the method comprising:
providing electrically conductive structures that extend perpendicularly from the first surface of the control die to a first exterior surface of the multi-die package to enforce a structural offset of the control die from the first exterior surface;
mounting the MEMS die to the control die using a thermally-conductive material, so as to place the circuitry to sense the temperature and a MEMS structure with a movable element in thermal communication with one another and in a manner such that the MEMS die and the control die are electrically-connected to one another to provide for electrical communication therebetween; and
disposing encapsulation material between and in contact with the electrically conductive structures in a manner so as to encapsulate the MEMS die.

13. The method of claim 12 wherein the control die comprises a complementary metal oxide semiconductor (CMOS) die, and wherein forming the electrically conductive structures that extend from the first surface of the control die comprises electrically coupling the electrically conductive structures with constituent electrical contacts of the CMOS die.

14. The method of claim 12 wherein the electrically conductive structures are part of a common lead frame and wherein providing the electrically conductive pillars comprises mounting the control die to the lead frame.

15. The method of claim 12 wherein forming the electrically conductive structures that extend from the first surface of the control die comprises exposing the electrically conductive structures at a lateral surface of the multi-die package, the lateral surface being perpendicular to the first surface of the control die and perpendicular to the first exterior surface.

16. The method of claim 12 wherein the thermally-conductive material comprises an epoxy having silver particles, and wherein mounting the MEMS die to the control die comprises using the epoxy to adhere the MEMS die to the control die.

17. The method of claim 12 wherein mounting the MEMS die to the controls die in a manner comprises using bond-wires to electrically-couple the MEMS die to the control die.

18. The method of claim 12 wherein mounting the MEMS die to the controls die in a manner comprises using solder bumps to electrically-couple the MEMS die to the control die.

19. The method of claim 12 wherein mounting the MEMS die to the control die comprises mounting a MEMS die having a resonant MEMS structure to a control die that, when powered, outputs a time-varying drive signal to the MEMS die to effect resonant motion of the resonant MEMS structure.

20. The method of claim 12 wherein mounting the MEMS die to the control die comprises mounting a MEMS die having a resonant MEMS structure to the control die, wherein said circuitry is to compensate a frequency output in dependence on motion of the MEMS resonant structure as a function of temperature sensed by said circuitry.

21. The method of claim 12 wherein disposing encapsulation material between and in contact with the electrically conductive structures to encapsulate the MEMS die comprises disposing encapsulation material within a three-dimensional region of the multi-die package between the electrically conductive structures and between the first surface of the control die and the first exterior surface of the multi-die package.

22. The method of claim 12 wherein disposing encapsulation material between and in contact with the electrically conductive structures to encapsulate the MEMS die comprises disposing plastic encapsulant between and in contact with the electrically conductive structures and in a manner that encapsulates the MEMS die.

23. The method of claim 12 wherein mounting the MEMS die to the control die comprises mounting a die having a resonant MEMS structure to a die having circuitry to output a time-varying drive signal to the MEMS die to effect resonant motion of the resonant MEMS structure.

24. The method of claim 12 wherein mounting the MEMS die to the control die comprises flip-chip mounting the MEMS die to the first surface of the control die via electrically conductive elements.

* * * * *